US010374147B2

(12) United States Patent
Pinarbasi et al.

(10) Patent No.: US 10,374,147 B2
(45) Date of Patent: Aug. 6, 2019

(54) PERPENDICULAR MAGNETIC TUNNEL JUNCTION HAVING IMPROVED REFERENCE LAYER STABILITY

(71) Applicant: Spin Memory, Inc., Fremont, CA (US)

(72) Inventors: Mustafa Pinarbasi, Morgan Hill, CA (US); Bartlomiej Adam Kardasz, Pleasanton, CA (US); Jorge Vasquez, San Jose, CA (US); Manfred Ernst Schabes, Saratoga, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/859,460

(22) Filed: Dec. 30, 2017

(65) Prior Publication Data

US 2019/0207092 A1 Jul. 4, 2019

(51) Int. Cl.

| | |
|---|---|
| ***G11C 11/00*** | (2006.01) |
| ***G11C 11/15*** | (2006.01) |
| ***H01L 43/02*** | (2006.01) |
| ***H01L 43/08*** | (2006.01) |
| ***H01L 43/10*** | (2006.01) |
| ***H01F 10/32*** | (2006.01) |
| ***G11C 11/16*** | (2006.01) |
| ***H01L 27/22*** | (2006.01) |

(52) U.S. Cl.

CPC ............ *H01L 43/02* (2013.01); *G11C 11/161* (2013.01); *G11C 11/1675* (2013.01); *H01F 10/329* (2013.01); *H01F 10/3286* (2013.01); *H01L 27/222* (2013.01); *H01L 43/08* (2013.01); *H01L 43/10* (2013.01)

(58) Field of Classification Search

CPC ....... H01L 43/02; H01L 27/222; H01L 43/08; H01L 43/10; G11C 11/161; G11C 11/1675; H01F 10/3286; H01F 10/329

USPC ........................................ 365/158, 171, 173

See application file for complete search history.

(56) References Cited

U.S. PATENT DOCUMENTS

| | | | | |
|---|---|---|---|---|
| 6,327,122 | B1 * | 12/2001 | Pinarbasi | B82Y 10/00 360/324.11 |
| 6,353,519 | B2 * | 3/2002 | Pinarbasi | B82Y 10/00 360/324.11 |
| 7,476,954 | B2 * | 1/2009 | Wang | B82Y 10/00 257/421 |
| 8,247,093 | B2 * | 8/2012 | Rodmacq | B82Y 25/00 428/812 |
| 8,508,006 | B2 * | 8/2013 | Jan | H01L 43/08 257/108 |

(Continued)

*Primary Examiner* — Viet Q Nguyen
(74) *Attorney, Agent, or Firm* — Zilka-Kotab, P.C.

(57) ABSTRACT

A magnetic data recording element for magnetic random access memory data recording. The magnetic data recording element includes a magnetic tunnel junction element that includes a magnetic reference layer, a magnetic free layer and a non-magnetic barrier layer located between the non-magnetic reference layer and the magnetic free layer. The magnetic reference layer includes a layer of Hf that causes the magnetic reference layer to have an increased perpendicular magnetic anisotropy. This increased perpendicular magnetic anisotropy improves reliability and stability of the magnetic data recording element by preventing loss of magnetic orientation of the magnetic reference layer such as during high writing current conditions.

20 Claims, 4 Drawing Sheets

(56) References Cited

U.S. PATENT DOCUMENTS

| | | | | |
|---|---|---|---|---|
| 8,871,530 | B1 * | 10/2014 | Hu | H01L 43/02 257/E21.208 |
| 9,059,399 | B2 * | 6/2015 | Hu | H01L 43/12 |
| 9,450,020 | B2 * | 9/2016 | Khalili Amiri | G11C 11/16 |
| 9,741,926 | B1 * | 8/2017 | Pinarbasi | H01L 43/08 |
| 9,963,780 | B2 * | 5/2018 | Hu | C23C 14/024 |
| 9,966,529 | B1 * | 5/2018 | Iwata | H01F 10/142 |
| 10,008,663 | B1 * | 6/2018 | Hao | H01L 43/10 |
| 2012/0063221 | A1 * | 3/2012 | Yamane | B82Y 25/00 365/173 |
| 2012/0286382 | A1 * | 11/2012 | Jan | G01R 33/098 257/421 |
| 2015/0137289 | A1 * | 5/2015 | Khalili Amiri | G11C 11/16 257/421 |
| 2018/0301266 | A1 * | 10/2018 | Ou | G11C 11/1675 |

* cited by examiner

PERPENDICULAR MAGNETIC TUNNEL JUNCTION HAVING IMPROVED REFERENCE LAYER STABILITY

FIELD OF THE INVENTION

The present invention relates to magnetic random access memory (MRAM) and more particularly to a perpendicular magnetic tunnel junction element having a reference layer that incorporates a layer of Hf for increased perpendicular magnetic anisotropy (PMA) and improved interlayer coupling ($H_{in}$).

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When, the orientations of the magnetizations of the free and reference layer are oriented in the same direction, the spin of the electrons in the free layer are in generally the same direction as the orientation of the spin of the electrons in the reference layer. Because these electron spins are in generally the same direction, the electrons can pass relatively easily through the tunnel barrier layer. However, if the orientations of the magnetizations of the free and reference layers are opposite to one another, the spin of electrons in the free layer will be generally opposite to the spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as an on or “1”, whereas the high resistance state can be read as a “0”. In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation. Once the magnetization of the free layer has been switched by the current, the state of the MTJ element can be read by reading a voltage across the MTJ element, thereby determining whether the MTJ element is in a “1” or “0” bit state. Advantageously, once the switching electrical current has been removed, the magnetic state of the free layer will remain in the switched orientation until such time as another electrical current is applied to again switch the MTJ element. Therefore, the recorded date bit is non-volatile in that it remains intact in the absence of any electrical power.

SUMMARY

The present invention provides a magnetic random access memory element that includes a magnetic reference layer, a magnetic free layer and a non-magnetic barrier layer located between the magnetic reference layer and the magnetic free layer. The magnetic reference layer includes at least one magnetic layer and a layer of Hf.

The layer of Hf in the magnetic reference layer advantageously increases the perpendicular magnetic anisotropy (PMA) and lowers the $H_{in}$ of the magnetic reference to provide improved resistance to loss of magnetization of the magnetic reference layer. This increases reliability and thermal stability of the magnetic memory element.

High speed data recording requires high write currents to flip the magnetic state of the free layer when writing data to the magnetic data recording element. These high electrical currents can cause instability in the reference layer which in turn will create write errors of the data. The increased PMA and lowered $H_{in}$ afforded by the presence of the Hf layer in the magnetic reference layer prevents such loss of magnetic stability of the magnetic reference layer, even at such high write current operation conditions.

The layer of Hf can be formed at various locations within the magnetic reference layer. For example, the magnetic reference layer can include a separation layer such as Mo located between magnetic layers of the magnetic reference layer and the layer of Hf can be located next to the barrier layer between a magnetic layer and the barrier layer. The layer of Hf could also be located between magnetic layers within the magnetic reference layer and can also be formed as a part of a bi-layer structure that includes the layer of Hf and a layer of MgO.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
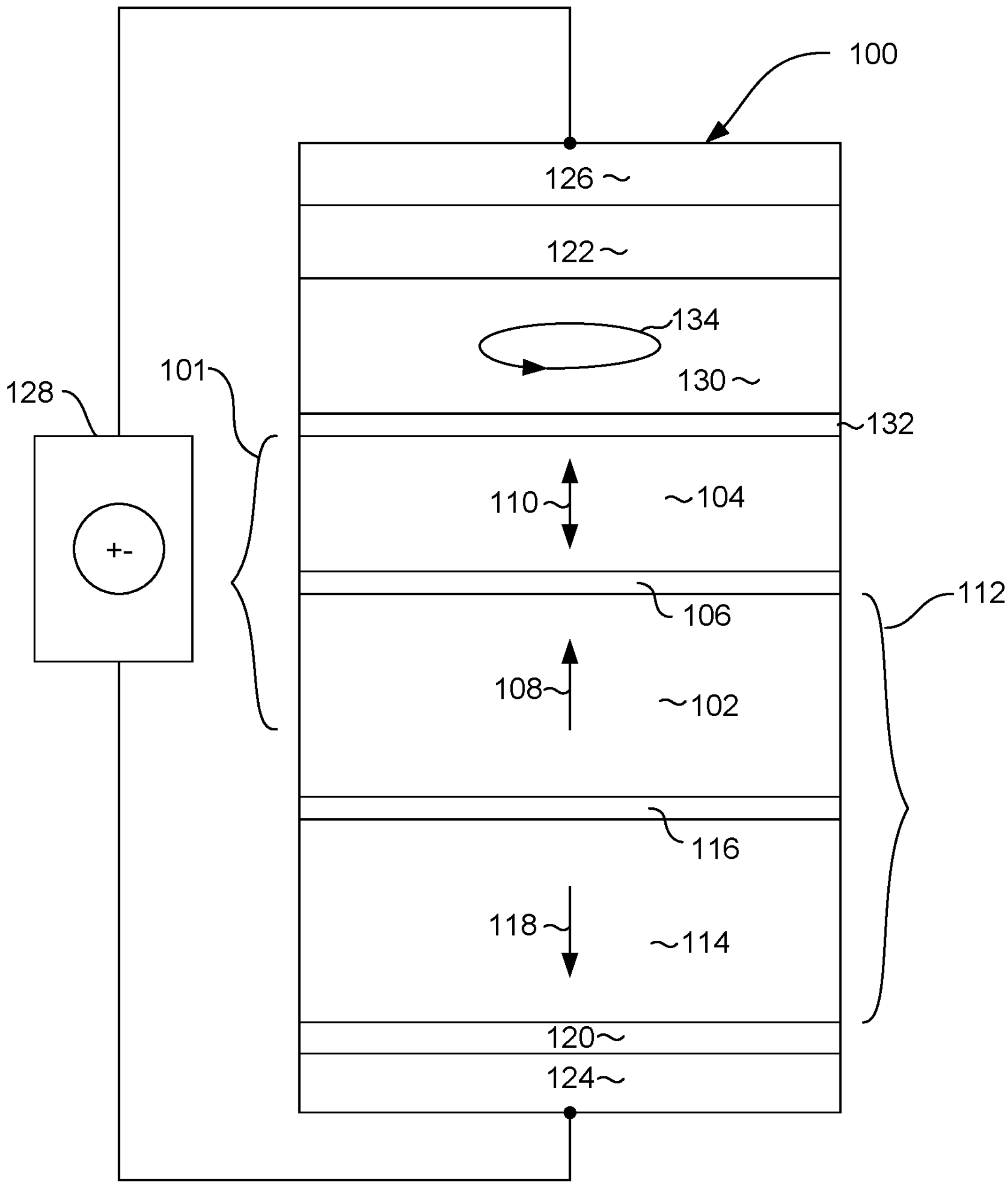
FIG. 1 is a schematic, cross sectional view of a perpendicular magnetic tunnel junction (pTMR) element, such as might be used in an embodiment of the invention.

Referring now to FIG. 1, a magnetic memory element 100 can be in the form a of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as Mg—O. The magnetic reference layer has a magnetization 108 that is fixed in a direction that is preferably perpendicular to the plane of the layers as indicated by arrow 108. The magnetic free layer has a magnetization 110 that can be in either of two directions perpendicular to the plane of the layer 104. While the magnetization 110 of the free layer remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116 can be a material such as Ru and can be constructed to have a thickness such that it ferromagnetically antiparallel couples the layers 114, 102. The antiparallel coupling between the layers 114, 102 pins the magnetization 108 of the reference layer 102 in a second direction opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing. Also, electrodes 124, 126 may be provided at the top and bottom of the memory element 100. The electrodes 124, 126 may be constructed of a non-magnetic, electrically conductive material such as Cu and can provide electrical connection with circuitry 128 that can include a current source and can further include circuitry for reading an electrical resistance across the memory element 100.

The magnetic free layer 104 has a magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. Because the magnetization 110 of the free layer 104 is in the same directions as the magnetization 108 of the reference layer 102, the electrons with opposite spin will not be able to pass through the barrier layer 106 into the reference layer 108. As a result, the electrons with the opposite spin will accumulate at the junction between the free layer 104 and barrier layer 106. This accumulation of spin polarized electrons causes a spin torque that causes the magnetization 110 of the free layer 104 to flip from an upward direction to a downward direction.

In order to assist the switching of the magnetization 110 of the free layer 104, the memory element 100 may include a spin polarization structure 130 formed above the free layer 104. The spin polarization layer can be separated from the free layer 104 by an exchange coupling layer 132. The spin polarization structure 130 has a magnetic anisotropy that causes it to have a magnetization 134 with a primary component oriented in the in plane direction (e.g. perpendicular to the magnetizations 110, 108 of the free and reference layers 104, 102. The magnetization 134, of the spin polarization layer 130 may either be stationary or can move in a precessional manner as shown in FIG. 100. The magnetization 134 of the spin polarization layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

Reference layer stability is critical to the operation of a magnetic tunnel junction memory element in a magnetic random access memory system. If the reference layer loses its magnetization orientation, the memory element will cease to function correctly, leading to write errors. This becomes even more of an issue at higher switching speeds, wherein higher write currents result in increased instability of the magnetic reference layer. The higher currents used to switch the free layer will induce sufficiently high enough spin torque that may initiate precession or switch the reference layer magnetization. The present invention, embodiments of which are illustrates herein below, provides a structure for increasing reference layer stability to ensure reliability of a magnetic memory element even at high switching speeds with high switching currents.

Figure 2:
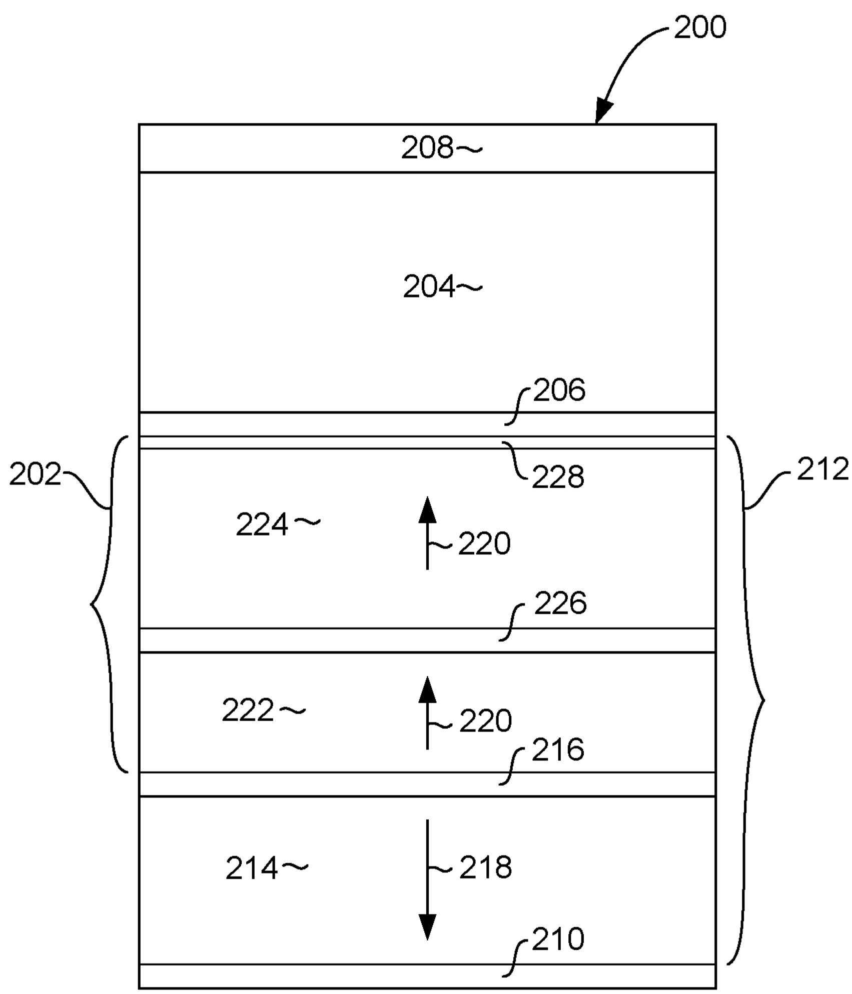
FIG. 2 is a schematic, cross sectional view of a perpendicular magnetic tunnel junction (pTMR) element according to an embodiment.

FIG. 2 shows a magnetic tunnel junction memory element 200 according to one possible embodiment of the invention. The memory element includes a magnetic reference layer structure 202, a magnetic free layer structure 204 and a non-magnetic barrier layer 206 located between the magnetic reference layer structure 202 and magnetic free layer structure 204. The magnetic free layer structure 204 can be constructed of a material such as CoFeB and the thin, non-magnetic barrier layer 206 can be a thin layer of non-magnetic material such as MgO.

A capping layer 208 may be provided at the top of the magnetic tunnel junction element 200 to protect the underlying layers such as the magnetic free layer 204 during manufacture. The capping layer 208 can include a layer of MgO and could include various other layers as well. In addition, one or more seed layers 210 can be provided at the bottom of the magnetic tunnel junction element 200. The seed layer 210 can be a material chosen to enhance a desired crystalline structure in above deposited layers for improved magnetic performance.

The reference layer 202 can be a part of an anti-parallel coupled, synthetic antiferromagnetic (SAF) structure 212 that includes a first magnetic layer (SAF1) 214 and a second magnetic layer structure (SAF2) (reference layer structure 202) which are both anti-parallel exchange coupled across an anti-parallel exchange coupling layer 216. The anti-parallel coupled exchange coupling layer 216 can be a material such as Ru, and has a thickness that is chosen to maintain an anti-parallel exchange coupling between the magnetic structures (SAF1) 214 and SAF2 202. For example, the layer 216 could be a layer of Ru having a thickness of 4-6 Angstroms. The anti-parallel coupling of the SAF1 and SAF2 layers 214, 202 causes the layers 214, 202 to have magnetizations that are pinned in directions opposite to one another. This is indicated by arrow 218 for the SAF1 layer 214 and by arrows 220, for the SAF2 structure 202. The antiparallel exchange coupling of these layers 214, 220 helps to maintain these pinned magnetizations 218, 220.

However, as discussed above, at high speed data recording, which requires high write currents, spin torque on the reference layer can cause the reference layer structure 202 to lose its pinned magnetization. In order to improve reference layer magnetic stability it is desirable to increase the perpendicular magnetic anisotropy (PMA) of the reference layer structure 202 and also to lower the internal field $H_{in}$ of the reference layer structure 202.

The present invention provides a structure which advantageously achieves these goals of increasing PMA and lowering $H_{in}$ to assure reference layer stability, even at high write currents. An example of a structure that achieves these goals is described with reference to FIG. 2. The reference layer 202 can be formed with magnetic layers 222, 224 having a thin separation layer 226 disposed therein, between the layers 222, 224. The magnetic layers 222, 224 can be a material such as CoFeB. The separation layer 226 in this described embodiment can be Mo and is preferably constructed to be sufficiently thin to maintain exchange coupling between the magnetic layers 222, 224 while increasing the PMA. To keep the ferromagnetic exchange coupling-, the spacer 226 preferably has a thickness of only 1-3 Angstroms.

In order to further increase perpendicular magnetic anisotropy and reduce $H_{in}$, the reference layer structure 202 includes thin layer of Hf 228, which greatly increases the perpendicular magnetic anisotropy to ensure magnetic stability of the reference layer structure 202 even at high temperatures. In the embodiment described with reference to FIG. 2, the reference layer structure 202 includes a layer of Hf 228 that is located next to the barrier layer 206 between the magnetic layer 224 and the barrier layer 206. The Hf layer 228 is preferably very thin so as not to degrade TMR performance. Therefore, the Hf layer 228 preferably has a thickness of only 1-3 Angstroms, or more preferably about 1 Angstrom, which provides effective gains in reference layer stability while keeping the TMR performance.

In the structure 202, the magnetic layer 224 closest to the barrier layer 206 has the greatest impact on magnetic tunnel junction ratio (TMR). Therefore, this magnetic layer 224 could be considered to be the reference layer. However, in the structure shown in FIG. 2, it can be seen that the magnetic layers 222, 224 are exchange coupled so that they have magnetizations 220 that remain in the same direction. Therefore, the entire structure 202, including 222, 226, 224, 228 functions magnetically as one unit, and for purposes of illustration will be referred to herein as a reference layer structure 202.

Figure 3:
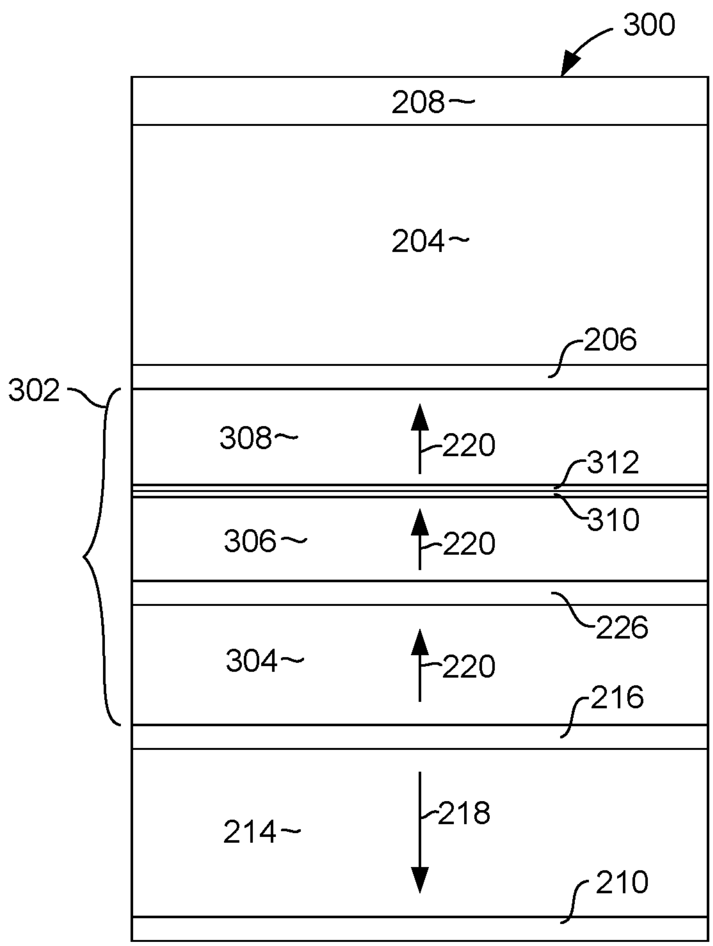
FIG. 3 is a schematic, cross sectional view of a perpendicular magnetic tunnel junction (pTMR) element according to another embodiment.

With reference now to FIG. 3, another embodiment of a magnetic memory element 300 is described, having a magnetic reference layer structure 302 that increases magnetic stability of the reference layer 302. In this embodiment, the reference layer structure 302 can include first, second, and third magnetic layers 304, 306, 308, which can each be constructed of a magnetic material such as CoFeB. The reference layer structure 302 can also include a separation layer 226, which can be located between the first and second magnetic layers 304, 306. As before, the separation layer can be constructed of Mo, and is formed to be sufficiently thin as to not break exchange coupling between the first and second layers 304, 306.

In the embodiment 300 of FIG. 3, the reference layer 302 also includes a layer of Hf. In this embodiment, a bi-layer structure that includes a layer of Hf 310 and a layer of Mo 312 is located between the second and third magnetic layers 306, 308. The layers of Hf 310 and Mo 312 are formed sufficiently thin that they do not break exchange coupling between the second and third magnetic layers 306, 308 Each of the layers 310, 312 is preferably only 1-3 Angstroms thick. Because the magnetic layers 304, 306, 308 remain exchange coupled with one another, they also remain magnetized in the same direction as indicated by arrows 220, so that the entire structure 302 acts magnetically as a single unit.

Figure 4:
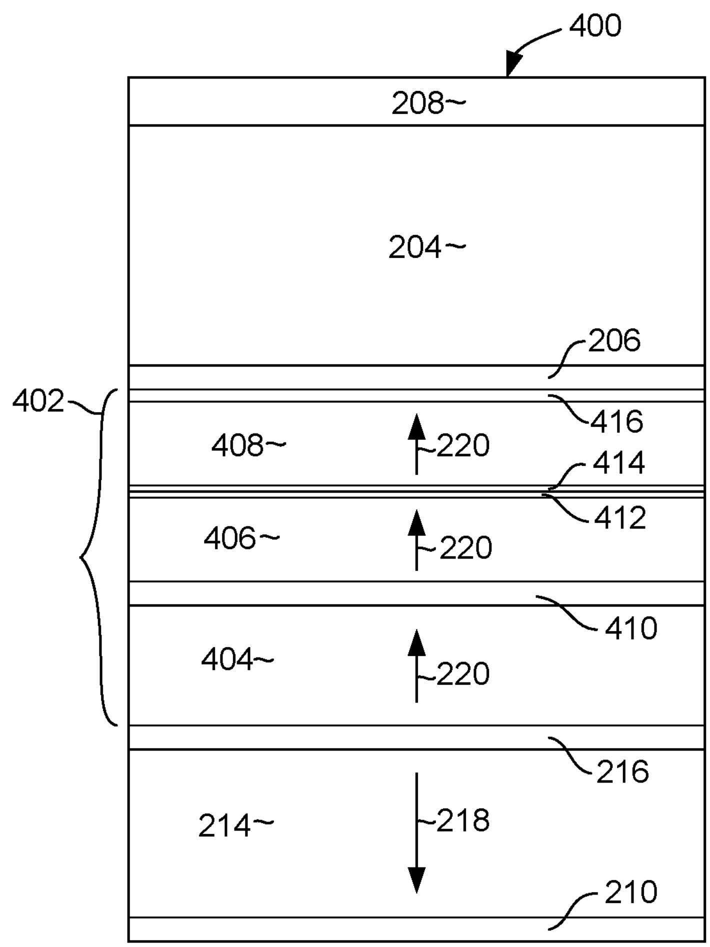
FIG. 4 is a schematic, cross sectional view of a perpendicular magnetic tunnel junction (pTMR) element according to yet another embodiment.

With reference now to FIG. 4, in still another embodiment more than one layer of Hf can be introduced into the reference layer to increase magnetic reference layer stability. FIG. 4 illustrates a magnetic memory element 400 that includes a reference layer structure 402 having first, second and third magnetic layers 404, 406, 408. Again, each of the magnetic layers 404, 406, 408 has a magnetization 220 that is oriented in the same direction so that the entire structure 402 acts magnetically as a single unit. The reference layer structure 402 includes a separation layer 410 that can be formed of Mo and that is sufficiently thin to not break exchange coupling between the first and second magnetic layers 404, 406. The reference layer structure 402 also includes a PMA enhancing structure that includes a first layer 412 of Hf and a second layer 414 of Mg—O both of which are located between the second and third magnetic layers 406, 408. Again, the layers 412, 414 are constructed sufficiently thin to not break exchange coupling between the second and third magnetic layers 406, 408. Also, the MgO layer is formed to be sufficiently thin to avoid increasing resistance area product, RA.

In addition to the Hf layer 412 of the bi-layer structure 412, 414, an additional layer of Hf 416 is located between the third magnetic layer 408 and the barrier layer 206. The layer of Hf 416 can be as thin as 1 Angstrom to provide PMA enhancing effects without negatively impacting tunneling magnetoresistance (TMR) values.

The above embodiments described with reference to FIGS. 2-4, illustrate several specific embodiments in which one or more layers of Hf can be incorporated into a reference layer structure of a magnetic tunnel junction element to enhance perpendicular magnetic anisotropy (PMA) of a reference layer. Other possible specific configurations are possible which also fall within the scope of the invention. For example, one or more layers of Hf can be placed at other locations within a reference layer that have not been specifically described by the above embodiments. In addition, the addition of a Hf layer into a reference layer structure can be included multiple times at various different locations within or adjacent to the magnetic reference layer.

The addition of Hf into the reference layer to increase perpendicular magnetic anisotropy and Hin also allow the magnetic memory element to be constructed with increased tunneling magnetoresistance (TMR) such as by allowing the reference layer structure to be constructed thicker while still preventing reference layer instability.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A magnetic random access memory element comprising:

a magnetic reference layer;

a magnetic free layer; and a non-magnetic barrier layer, located between the magnetic reference layer and the magnetic free layer;

the magnetic reference layer comprising at least one magnetic layer and a layer of Hf;

wherein the layer of Hf is located between the at least one magnetic layer and the non-magnetic barrier layer or the layer of Hf is located within the magnetic reference layer between a pair of magnetic layers.

2. The magnetic random access memory element as in claim 1, wherein the layer of Hf contacts the non-magnetic barrier layer.

3. The magnetic random access memory element as in claim 1, wherein the layer of Hf is part of a bi-layer structure that includes the layer of Hf and a layer of Mg—O.

4. The magnetic random access memory element as in claim 3, wherein the layer of Mg—O has a thickness that is no greater than 3 Angstroms.

5. The magnetic random access memory element as in claim 1, wherein the layer of Hf has a thickness that is not greater than 3 Angstroms.

6. The magnetic random access memory element as in claim 1, wherein the layer of Hf has a thickness of 1 Angstrom.

7. The magnetic random access memory element as in claim 1, wherein the magnetic reference layer further comprises a second layer of Hf.

8. The magnetic random access memory element as in claim 1, wherein the reference layer comprises a plurality of layers of Hf at different locations within the magnetic reference layer.

9. The magnetic random access memory element as in claim 1, wherein the reference layer further comprises, a separation layer located between magnetic layers.

10. The magnetic random access memory element as in claim 9, wherein the separation layer comprises Mo.

11. The magnetic random access memory element as in claim 1, wherein the layer of Hf is located between first and second layers of CoFeB.

12. The magnetic random access memory element as in claim 1, wherein the layer of Hf is located between a layer of CoFeB and a layer of MgO.

13. The magnetic random access memory element as in claim 1, wherein the layer of Hf has is located between first and second magnetic layers and wherein the layer of Hf has is sufficiently thin to avoid breaking exchange coupling between the first and second magnetic layers.

14. The magnetic random access memory element as in claim 1, wherein the layer of Hf is part of a bi-layer structure that includes the layer of Hf and a layer of Mo.

15. The magnetic random access memory element as in claim 14, wherein the layer of Hf and a layer of Mo is located between two magnetic layers of CofeB.

16. A magnetic random access memory element comprising:

a magnetic reference layer;

a magnetic free layer; and a non-magnetic barrier layer, located between the magnetic reference layer and the magnetic free layer;

the magnetic reference layer comprising:

first and second magnetic layers;

a separation layer located between the first and second layers; and a layer of Hf.

17. The magnetic random access memory element as in claim 16, wherein the layer of Hf is located between the second magnetic layer and the non-magnetic barrier layer.

18. The magnetic random access memory element as in claim 16 wherein the magnetic reference layer structure further comprises a third magnetic layer, and wherein the layer of Hf is located between the second and third magnetic layers.

19. The magnetic random access memory element as in claim 17, wherein the layer of Hf is part of a bi-layer structure that includes the layer of Hf and a layer of MgO.

20. A magnetic random access memory system, comprising:

a plurality of magnetic memory elements; and circuitry configured to write data to the plurality of magnetic memory elements and read data from the plurality of magnetic memory elements;

each of the plurality of magnetic memory elements further comprising:

a magnetic reference layer;

a magnetic free layer; and a non-magnetic barrier layer, located between the magnetic reference layer and the magnetic free layer; and the magnetic reference layer comprising at least one magnetic layer and a layer of Hf;

wherein the layer of Hf is located between the at least one magnetic layer and the non-magnetic barrier layer or the layer of Hf is located within the magnetic reference layer between a pair of magnetic layers.

* * * * *